United States Patent [19]

Harshavardhan et al.

[11] Patent Number: 5,145,832

[45] Date of Patent: Sep. 8, 1992

[54] SUPERCONDUCTING FILM ON A FLEXIBLE TWO-LAYER ZIRCONIA SUBSTRATE

[75] Inventors: Kolagani S. Harshavardhan; Samuel M. Sampere, both of Eatontown; Timothy D. Sands, Cranburry, all of N.J.; Thirumalai Venkatesan, Washington, D.C.

[73] Assignee: Bell Communications Research, Inc., Livingston, N.J.

[21] Appl. No.: 703,895

[22] Filed: May 22, 1991

[51] Int. Cl.$^5$ ................................ B32B 9/00
[52] U.S. Cl. ........................ 505/1; 428/688; 428/930; 505/701; 505/702; 505/703; 505/704
[58] Field of Search .................... 505/1, 701–704; 428/688, 930

[56] References Cited

U.S. PATENT DOCUMENTS 4,880,772  11/1989  Pederson et al. ................. 505/1

OTHER PUBLICATIONS

Madakson et al., J. Appl. Phys., 63, Mar. 15, 1988, p. 2046.
D. P. Norton et al., "Y-Ba-Cu-O thin films grown on rigid and flexible polycrystalline yttria-stabilized zirconia by pulsed laser ablation," *Journal of Applied Physics*, 1990, vol. 68, pp. 223–227.
E. Narumi et al., "Superconducting YBa$_2$Cu$_3$O$_{6.8}$ films on metallic substrates using in situ laser deposition," *Applied Physics Letters*, 1990, vol. 56, pp. 2684–2886.
R. K. Singh et al., "Theoretical model for deposition of superconducting thin films using pulsed laser evaporation technique," *Journal of Applied Physics*, 1990, vol. 68, pp. 233–246.
E. W. Chase et al., "Multilayer high T$_c$ thin film structures fabricated by pulsed laser deposition of Y-Ba-Cu-O," *Journal of Material Research*, 1989, vol. 4, pp. 1326–1329.
K. S. Harshavardhan et al., "Crystallography of the growth of Y-Ba-Cu-O films on single and polycrysalline zirconia substrates", Final Program and Abstracts, Materials Research Society, Spring Meeting, Apr. 29, 1991, Cl. 7, p. 87.
K. S. Harshardhan et al., "The interfaces between Y-Ba-Cu-O films and polycrystalline ZRO$_2$ substrates," Final Program and Abstracts, Materials Research Society, Spring Meeting, Apr. 29, 1991, P7 69, p. 328.

*Primary Examiner*—Patrick J. Ryan
*Assistant Examiner*—T. A. Powers
*Attorney, Agent, or Firm*—Leonard Charles Suchyta; Charles S. Guenzer

[57] ABSTRACT

A flexible superconducting wire element comprising a flexible tape of partially stabilized (~3 mole % yttria) yttria-stabilized zirconia (YSZ), a buffer layer of fully stabilized (between 8 and 18 mole % yttria, preferably 9 mole %) YSZ deposited on the flexible tape, and a high-temperature, perovskite superconductor such as YBaCuO deposited on the buffer layer. The tape provides the strength while remaining flexible. The buffer layer is flexible because of its thinness (~100 nm), but provides a good crystallographic template for the growth of oriented perovskite superconductors. Thereby, the superconducting properties of the wire element approach those of a superconducting film deposited on a rigid substrate.

6 Claims, 1 Drawing Sheet

SUPERCONDUCTING FILM ON A FLEXIBLE TWO-LAYER ZIRCONIA SUBSTRATE

FIELD OF THE INVENTION

The invention relates generally to superconducting structures; in particular, it relates to a superconducting film grown on a flexible ceramic substrate.

BACKGROUND ART

If the high-$T_c$ superconductors are to be used in practical power applications, either for power transmission or for magnetic windings, they will need to be drawn as wire or grown as films on flexible substrates, which will probably be wound on metal support cables or magnetic yokes. To date, three approaches have achieved significant results: the extrusion of bismuth-based superconductors, melt-textured growth of bulk $YBa_2Cu_3O_{7-x}$ (YBCO), and growth of oriented thin films on flexible substrates.

Many groups have reported successful epitaxial growth of high quality thin films on singly crystalline substrates. High quality is ultimately defined by high values of the superconducting transition temperature $T_c$ and the critical current $J_c$ defining the upper limits of superconducting behavior. While singly crystalline substrates may be satisfactory for applications resembling semiconductor integrated circuits, their rigidity and expense preclude their use in many applications of commercial significance, for example, interconnects between computer boards, commercial power lines, and magnet windings. Therefore, flexible substrates have been investigated. Norton et al. have disclosed substrates of yttria-stabilized zirconia (YSZ) in "Y-Ba-Cu-O thin films grown on rigid and flexible polycrystalline yttria-stabilized zirconia by pulsed laser ablation," *Journal of Applied Physics*, volume 68, 1990, pp. 223–227. Zirconia ($ZrO_2$) assumes a monoclinic (or tetragonal for thin films) crystal structure but is stabilized in a cubic crystal structure when combined with yttria ($Y_2O_3$). The rigid polycrystalline YSZ substrates were stabilized with 3 mole % of $Y_2O_3$, while the thin flexible sintered zirconia substrates were prepared using a proprietary and undisclosed sheet-forming method. When $YBa_2Cu_3O_{7-x}$ (YBCO) was deposited on the rigid substrates, it exhibited a $T_c$ of ~89° K. (a few degrees below the best transition temperatures for YBCO epitaxially grown on singly crystalline substrates), but when grown on the flexible zirconia substrate $T_c$ was degraded to about 85° K. Norton et al. noted that the randomly oriented, polycrystalline rigid YSZ substrate produced thin films of YBCO having its c-axis highly aligned perpendicularly to the substrate. Narumi et al. have disclosed growing YBCO on a flexible metallic substrate in "Superconducting $YBa_2Cu_3O_{6.8}$ films on metallic substrates using in situ laser deposition," *Applied Physics Letters*, volume 56, 1990, pp. 2684–2686. They used a buffer layer of 8 mole % YSZ between the YBCO and the flexible metallic substrate, which produced transition temperatures $T_c$ of no more than 83° K. This further degradation in $T_c$ is considered unsatisfactory. They considered that the buffer layer reduced the effect of the oxidized metallic surface but that the buffer layer did not prevent the substrate grains from producing granular boundaries in the YBCO.

SUMMARY OF THE INVENTION

Accordingly, it is an object of the invention to provide a superconducting thin film having a high transition temperature that is grown on a flexible substrate.

The invention can be summarized as a superconducting thin film, for example, of $YBa_2Cu_3O_{7-x}$, grown on a fully yttria-stabilized (between 8 and 18 mole %, preferably 9 mole %) zirconia thin film that is grown on a flexible, partially yttria-stabilized (less than 8 mole % and preferably 3 mole %) zirconia substrate.

DETAILED DESCRIPTION OF THE PREFERRED EMBODIMENTS

Figure 1:
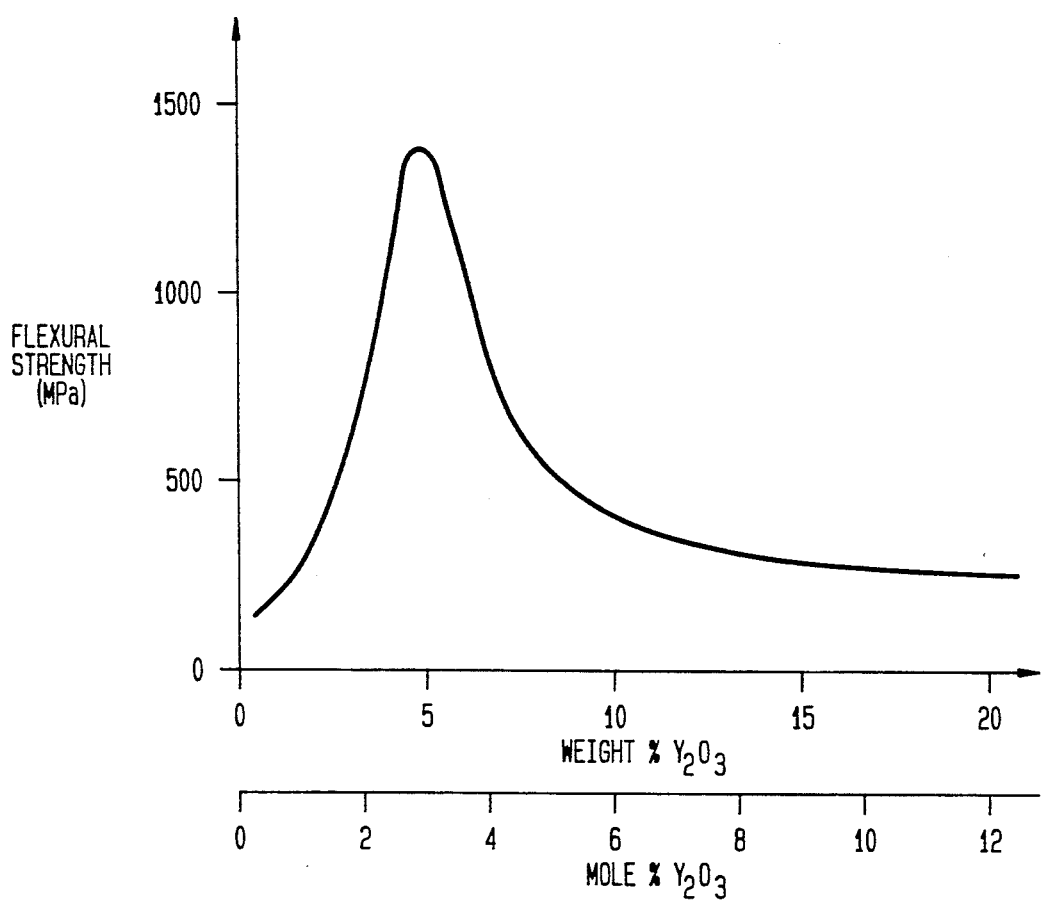
FIG. 1 is an illustration of the dependence of strength upon the degree of stabilization in yttria-stabilized zirconia.

The stabilization of zirconia by yttria is complete only when yttria is present in yttria-stabilized zirconia (YSZ) to a fraction above a lower limit of between 8 and 9 mole %. Below this level, separate crystallites of the monoclinic and cubic phases are present. Above a fraction of about 18 mole %, the yttria and zirconia phase separate. Within this range of 8 to 18 mole %, YSZ is fully stabilized. The precise value of the lower limit tends to fluctuate so that it is better to use 9 mole % to ensure full stabilization. FIG. 1 illustrates the flexural strength of yttria-stabilized zirconia as a function of weight percentage and mole percentage of yttria in crystalline YSZ. Around 3 mole %, the YSZ has maximum flexural strength, about five times the value for fully stabilized YSZ. A very similar plot is obtained when the fracture toughness is measured. The Vickers hardness increases with stabilization percentage up to about 8 mole %. Thus, a 3 mole % stabilized YSZ substrate provides the desired flexibility. However, to achieve the best transition temperatures, a more fully stabilized substrate is desirable.

Figure 2:
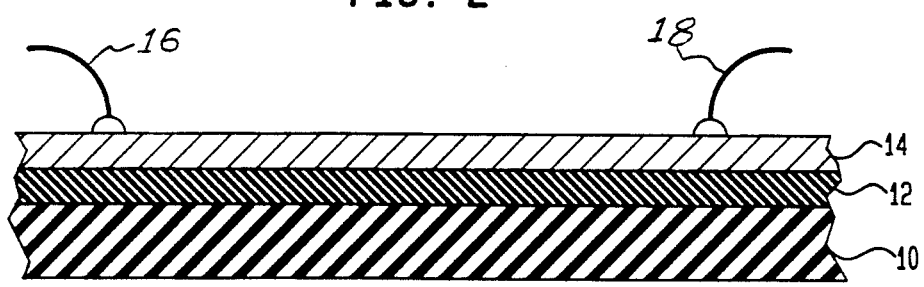
FIG. 2 is a cross-sectional view of an embodiment of the invention.

An embodiment of the invention is illustrated in cross-section in FIG. 2. The structure is grown on a substrate 10 of 3 mole % YSZ, that is, having a composition of maximum flexibility. A thin-film buffer layer 12 of fully stabilized or 8 mole % or greater YSZ is grown on the substrate 10. A superconducting thin film 14 of, for example, $YBa_2Cu_3O_{7-x}$ (YBCO) is grown on the buffer layer 12. When electrical leads 16 and 18 are attached to the YBCO thin film 14 and its temperature is reduced to below its superconducting transition temperature $T_c$, it conducts electrical power with zero resistance and thus no power loss.

The 3 mole % YSZ substrate 10 provides the structural strength while maintaining its flexibility. Although 3 mole % YSZ appears to be the optimal composition, adequate strength, toughness, and hardness are obtained over the compositional range of 2 mole % to 5 mole % YSZ. The substrate 10 of this 3 mole % composition is commercially available but is likely to be polycrystalline. It typically has a flexural strength of ~1500 MPa and a fracture toughness of ~8 MPa. The 8 mole % buffer layer 12 is a thin film so that it is inherently flexible. Its fully stabilized composition insures a good crystalline structure and thus acts as a good template and chemical barrier for the deposition of superconducting material of high $T_c$.

EXAMPLE

The invention was experimentally verified using pulsed laser ablation for the deposition of both the fully stabilized YSZ layer 12 and the YBCO layer 14. This deposition method is well known in the deposition of superconducting films and has been described in detail by Singh et al. in "Theoretical model for deposition of superconducting thin films using pulsed laser evaporation technique," *Journal of Applied Physics*, volume 68, 1990, pp. 233-246. For our depositions, a KrF excimer laser delivered optical pulses of 248 nm radiation with pulse widths of 20 ns, pulse energy densities of 1.5 J/cm$^2$ on stoichiometric targets, and pulse repetition rates of 5 Hz. The targets and the substrate were exposed to an oxygen partial pressure of $\sim$75 mTorr. The substrate holder holding the substrate 10 was held at a temperature of $\sim$800° C. for the fully stabilized YSZ layer 12 and at $\sim$740° C. for the YBCO layer 14.

The partially stabilized 3 mole % YSZ substrate 10 was in the form of a thin tape, about 0.05 mm thick and having a bend radius of about 1 cm. It is commercially available from Marketech International of Pittsburgh, Pa.

The target for the deposition of the fully stabilized buffer layer 12 was a single crystal of stoichiometric composition for 9.5 mole % YSZ, which is available from Commercial Crystal Laboratories, Inc. of Naples, Fla. The buffer layer 12 was deposited to a thickness of about 100 nm.

In fabricating the sample of the example, the chamber was brought to atmosphere between depositions of the two layers to replace the target on the rotating holder. However, it is preferable that the targets were held on a carousel of the sort described by Chase et al. in "Multilayer high $T_c$ thin film structures fabricated by pulsed laser deposition of Y-Ba-Cu-O," *Journal of Material Research*, volume 4, 1989, pp. 1326-1329. During the depositions of the YSZ and the YBCO, the carousel would rotate the chosen target about the target axis with the laser beam hitting a circumference of the target. Between the depositions, the carousel itself would rotate about its own axis to place the YBCO target in the laser beam. Thereby, the buffer layer 12 would not be exposed to ambient conditions between the deposition steps.

The target for the laser deposition of the YBCO layer 14 was a pellet of sintered powder of YBCO. The YBCO was deposited to a thickness of about 200 nm.

After the depositions, the film was cooled to room temperature at the rate of 12° C./min in 200 Torr of oxygen.

The resistance of the film as a function of temperature was measured by a four-probe DC technique. The YBCO film of the invention exhibited a superconducting transition temperature $T_c$ of 90° K. with a transition width $\Delta T_c$ of 1° to 1.5° K. The ratio $R_{300}/R_{95}$ of the room temperature resistance to the resistance at 95° K., just above the transition, was 2.2.

The critical current density, $J_c$ at which superconductivity deteriorates (such that a voltage drop of 1 $\mu$V/cm is observed along the conductor) was estimated both by magnetization measurements and by I-V measurements using 125 $\mu$m-wide and 2 mm-long bridges. At 77° K. and zero applied magnetic field, $J_c$ was $0.9 \times 10^4$ A/cm$^2$.

The crystallography of the film was determined by x-ray diffraction and transmission electron microscopy (TEM). The diffraction pattern was consistent with a c-axis orientation of the film, and there were no discernible reflections from other orientations. The TEM micrographs showed that the 100 nm fully stabilized YSZ buffer layer did not stop substrate grain boundaries from propagating into the YBCO film. Furthermore, it appeared that silicon contaminants in the substrate diffused into the grain boundaries of the YBCO film.

COMPARATIVE EXAMPLE 1

A YBCO film was grown on the 3 mole % YSZ substrate without an intermediate fully stabilized YSZ buffer layer. This film also exhibited a superconducting transition temperature $T_c$ of 90° K.; however, its transition width $\Delta T_c$ was 2° to 3° K. Its temperature ratio $R_{300}/R_{95}$ was 1.9. Its critical current $J_c$ was less than $10^3$ A/cm$^2$. Its x-ray pattern showed that the film was predominantly oriented along the c-axis, but the presence of (013), (011), and (103) reflections indicated a significant amount of YBCO of other orientations.

COMPARATIVE EXAMPLE 2

A YBCO film was grown directly on a singly crystalline substrate of 9 mole % fully stabilized YSZ having a (100) orientation. Its transition temperature $T_c$ was 91° K. Its critical current $J_c$ was $4.0 \times 10^6$ A/cm$^2$. Its temperature ratio $R_{300}/R_{95}$ was about 3.

COMPARATIVE EXAMPLE 3

A YBCO film was laser deposited on a 3 mole % buffer layer which had been itself laser deposited on a 3 mole % flexible tape. The superconducting properties degraded over those of the first comparative example in which the YBCO was deposited directly on the tape. The off-axis growths of the YBCO were about the same.

The various samples of the examples were electrically tested in applied magnetic fields. In general, the superconducting properties were improved with the use of a fully stabilized YSZ buffer layer.

These data show that the fully stabilized YSZ buffer layer on a partially stabilized, flexible YSZ substrate provides significantly larger critical currents in YBCO than YBCO films deposited directly on the flexible YSZ. The buffer layer apparently eliminates off-axis growth of the YBCO.

Although the invention has been described with reference to YBCO, almost all of the high-$T_c$ oxide superconductors have crystal structures similar to that of YBCO and exhibit similar superconducting properties, for example, the bismuth and thallium cuprate superconductors, and the bismuth potassium oxide superconductors. Therefore, the fully stabilized YSZ buffer layer of the invention can be beneficially used with all these other superconductors as well. Although pulsed laser ablation was used in the disclosed examples, the invention may be practiced with other deposition techniques, e.g., magnetron sputtering.

The invention thus provides a superconducting structure that is flexible but displays high superconducting transition temperatures and high critical currents. Therefore, it can be advantageously used in applications requiring the transmission of significant amounts electrical power over significant distances.

What is claimed is:

1. A flexible ceramic heterostructure, comprising:
    a substrate comprising partially stabilized yttria-stabilized zirconia having between 2 and 5 mole % yttria;

a buffer layer comprising fully stabilized yttria-stabilized zirconia having between 8 and 18 mole % yttria and deposited on said substrate; and a thin film comprising a high-temperature ceramic superconductor deposited on said buffer layer.

2. A flexible ceramic heterostructure as recited in claim 1, wherein said partially stabilized yttria-stabilized zirconia has approximately 3 mole % yttria.

3. A flexible heterostructure as recited in claim 1, wherein said ceramic superconductor comprises $YBa_2Cu_3O_{7-x}$.

4. A flexible heterostructure as recited in claim 1, wherein said ceramic superconductor comprises a bismuth cuprate superconductor.

5. A flexible heterostructure as recited in claim 1, wherein said ceramic superconductor comprises a thallium cuprate superconductor.

6. A flexible heterostructure as recited in claim 1, wherein said ceramic superconductor comprises a bismuth potassium oxide superconductor.

* * * * *